United States Patent [19]

Nishikawa et al.

[11] Patent Number: 4,737,903
[45] Date of Patent: Apr. 12, 1988

[54] ELECTRONIC APPARATUS

[75] Inventors: Hiroshi Nishikawa, Tokyo; Shunji Mitaka, Yokohama, both of Japan

[73] Assignee: Canon Kabushiki Kaisha, Tokyo, Japan

[21] Appl. No.: 921,791

[22] Filed: Oct. 14, 1986

Related U.S. Application Data

[63] Continuation of Ser. No. 597,261, Apr. 6, 1984, abandoned.

[30] Foreign Application Priority Data

Apr. 28, 1983 [JP] Japan .................................. 58-75850

[51] Int. Cl.$^4$ .............................................. H02M 1/00
[52] U.S. Cl. .................................... 363/144; 361/400; 439/55
[58] Field of Search ............... 361/397, 399, 400, 331, 361/413, 405, 406, 404; 363/8, 44, 144; 307/150; 339/17 C, 17 E, 17 R; 29/605, 606

[56] References Cited

U.S. PATENT DOCUMENTS

| Re. 31,704 | 10/1984 | Hester | 361/399 |
| 4,222,089 | 9/1980 | MacAskill, Jr. et al. | 361/399 |
| 4,471,898 | 9/1984 | Parker | 361/399 |
| 4,551,587 | 11/1985 | Rose | 200/295 |

FOREIGN PATENT DOCUMENTS 771701 4/1957 United Kingdom ................ 336/200

OTHER PUBLICATIONS

2 Board Design Techniques, Electronic Design, June 11, 1958, pp. 32–35.
Voltage Regulator Data Book 1983, Texas Instruments Inc., pp. 2–31.

Primary Examiner—Patrick R. Salce
Assistant Examiner—Judson H. Jones
Attorney, Agent, or Firm—Fitzpatrick, Cella, Harper & Scinto

[57] ABSTRACT

A power supply unit comprises a plug receptacle for receiving AC power, a power transformer for transforming the AC voltage supplied through the plug receptacle, a power switch for controlling supply and block of the AC voltage supplied through the plug receptacle, to the power transformer, and a printed circuit board for carrying and elecrically interconnecting the plug receptacle, the power transformer and the power switch.

8 Claims, 4 Drawing Sheets

ELECTRONIC APPARATUS

This application is a continuation of application Ser. No. 597,261, filed 4/6/84, now abandoned.

BACKGROUND OF THE INVENTION

1. Field of the Invention

The present invention relates to a power supply unit which receives an AC power supply and supplies an output of a self-contained power transformer as a power source.

2. Description of the Prior Art

In a power supply unit which receives an AC power supply as an input source or an electronic apparatus which incorporates such a power supply unit, at least a power switch and a power transformer are contained therein and those parts are usually connected through electric wires.

FIG. 1 shows a prior art power supply unit which is designed to meet a North American Safety Standard. A plug receptacle 2, a power switch 3 and a transformer 4 are fixed on a chassis 1 of an electronic apparatus. A plug 6 which is one end of a power supply cord having the other end thereof connected to an AC power supply is plugged in and out to and from the plug receptacle 2. Numeral 7 denotes a filtering capacitor. One wire 8 of at least two wires connected to the plug receptacle 2 is connected to the transformer 4 and the other wire 9 is connected to one terminal of the power switch 3, and a wire 10 connected to the other terminal of the power switch 3 is connected to the transformer 4 so that the AC power is supplied to the transformer 4 and the power switch 3. The transformer 4 is connected to a printed circuit board 11 fixed to the chassis 1 through a wire 12, and the capacitor 7 is also connected to the printed circuit board 11 through a wire 13.

In the illustrated example, the wires 8, 9 and 10 are double insulated wires in order to meet the North American Safety Standard, and those wires must be covered by tubes 14, 15 and 16 in order to assure safety of those portions which might contact a metal part, that is, the transformer 4.

Tubes 17 and 18 are required to fix and prevent detachment of soldered portions of the wires 9 and 10 and the power switch 3, and tubes 19 and 20 are required to prevent the wires soldered to the printed circuit board 11 from contacting the metal part of the power transformer when the wires are detached.

Thus, the prior art power supply unit needs many wire connections and the use of double insulated wires for the purpose of safety and the application of the tubes to prevent the movement of the wires is required because a high AC voltage is applied to those wires. Accordingly, a number of parts and a number of assembling steps increase, and hence manufacturing cost increases.

SUMMARY OF THE INVENTION

It is an object of the present invention to provide a power supply unit which is inexpensive and simple in wiring structure.

It is another object of the present invention to provide a power supply unit which can utilize the same wires and tubes to reduce a material cost and eliminates a need to remove coatings of the wires and apply tubes on the wires.

DETAILED DESCRIPTION OF THE PREFERRED EMBODIMENTS

Figure 1:
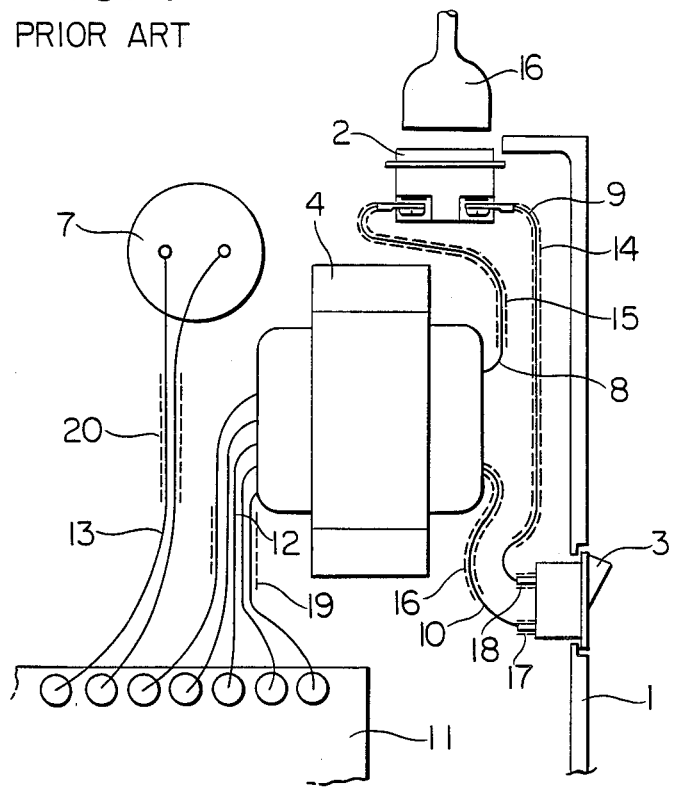
FIG. 1 shows a plan view of a prior art device.
Figure 2:
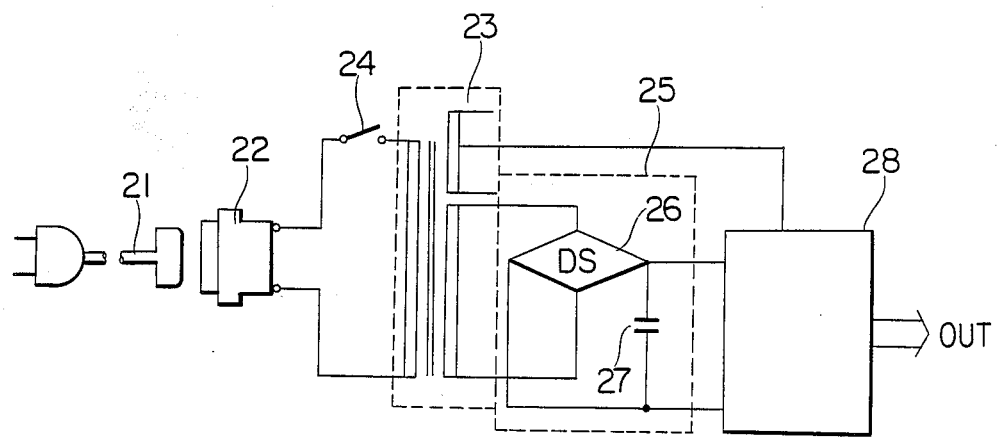
FIG. 2 shows a circuit diagram of one embodiment of a power supply unit of the present invention.

FIG. 2 shows a circuit diagram of one embodiment of a power supply unit of the present invention which receives AC power as an input power source.

Numeral 21 denotes a power supply cord for supplying an AC power, having one end thereof connected to a plug receptacle 22 which is a power supply inlet. Numeral 23 denotes a power transformer which transforms an AC voltage supplied through the power supply cord 21 and the plug receptacle 22 to a desired AC voltage. Numeral 24 denotes a power switch which is turned on and off by an operator to control the energization of the transformer 23 to activate or deactivate the power supply unit and an electronic apparatus in which the power supply unit is incorporated.

Numeral 25 denotes a rectifying-filtering circuit which rectifies the output AC voltage of the power transformer 23 by a diode stack 26 to produce a DC voltage and filters it to a DC voltage having a small ripple voltage with a capacitor 27.

Numeral 28 denotes a DC voltage regulator which prevents a voltage fluctuation of the DC voltage produced by the rectifying-filtering circuit 25 due to a change in a load to constantly produce a constant output voltage.

Figure 3:
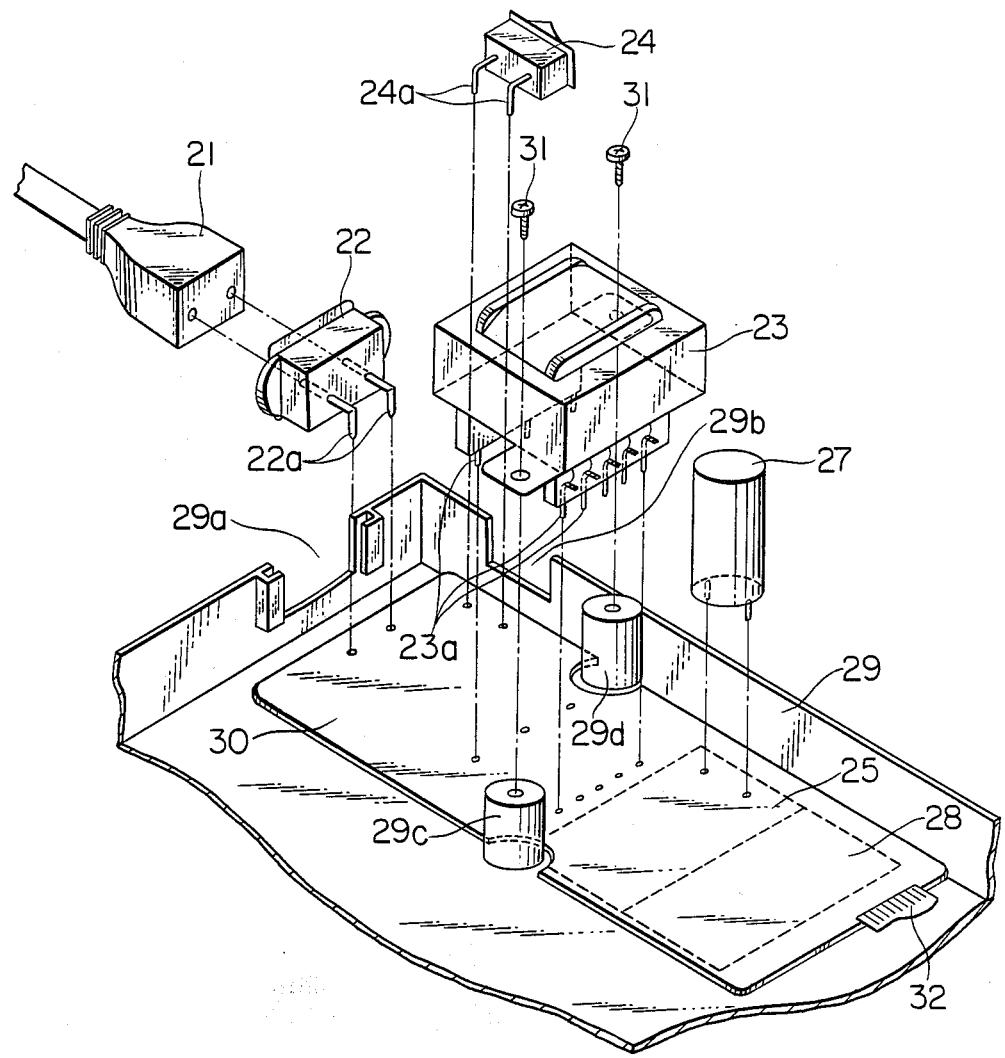
FIG. 3 shows a developed perspective view of the present embodiment.
Figure 4:
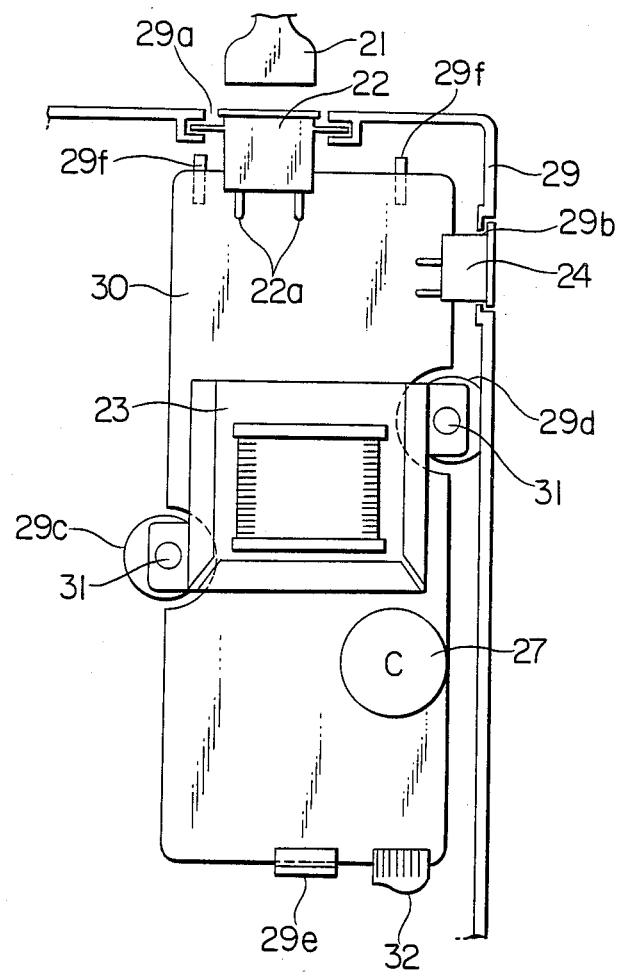
FIG. 4 shows a plan view of the present embodiment.
Figure 5:
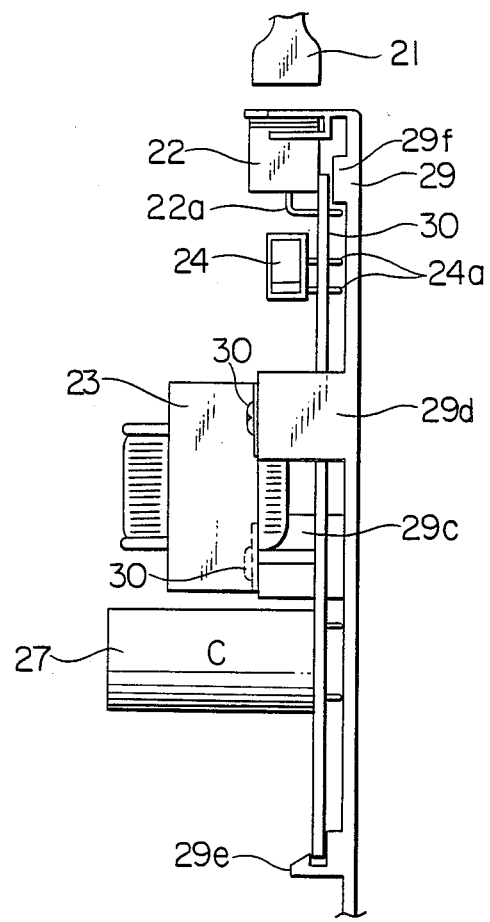
FIG. 5 shows a side view of the present embodiment.

FIGS. 3, 4 and 5 show structures of the present embodiment. Numeral 29 denotes a lower case of an electronic apparatus such as a desk-top calculator in which the present power supply unit is incorporated. It is mated with an upper case, not shown, to form a unified box-like case. The lower case 29 also functions as a chassis, and it holds the plug receptacle 22 fitted to a notch 29a, together with the upper case. The power switch 24 is also fitted in a notch 29b of the lower case 29 and held by the lower case 29 and the upper case. The transformer 23 is tightly clamped by bolts 31 to a pair of ribs 29c and 29d projecting from the bottom surface of the lower case 29. A hard printed circuit board 30 carrying the rectifying-filtering circuit 25 and DC voltage regulator 28 is directly soldered to connecting terminals 23a of the transformer 23 and fixed thereto. The printed circuit board 30 is not bolted to the lower case 29.

If the printed circuit board 30 is bolted to the lower case 29, a strong force due to bolting is applied to the soldered areas of the printed circuit board and the patterned lands of the soldered areas may be peeled off. Accordingly, the printed circuit board is not bolted to prevent the soldered areas from being peeled off.

One end of the printed circuit board 30 is mounted on a projection 29f (FIG. 4) which projects from the lower case 29 and the other end is held by a pawl 29e of the lower case 29 to prevent the movement of the printed circuit board 30 by vibration.

The terminals 22a and 24a of the plug receptacle 22 and the power switch 24 are bent in an L-shape and ends of the terminals are directly soldered to the printed circuit board 30 after the plug receptacle 22 and the power switch 24 have been fixed to the lower case 29. The filtering capacitor 27 is also directly attached to the printed circuit board 30. A flexible tape wire 32 having a number of lines printed thereon is attached to the printed circuit board to supply the output of the DC voltage regulator to other printed circuit boards carrying a linear circuit and a digital circuit.

In the present embodiment, the plug receptacle 22, the power switch 24 and the power transformer 23 are directly soldered to the printed circuit board 30 and connected to the copper patterns on the printed circuit board 30. Accordingly, no wire is required. Even if the part is detached from the printed circuit board 30, there is no risk which would occur when the wire is detached. Accordingly, the tubes for covering the wires for the purpose of safety can be eliminated.

As described hereinabove, according to the present invention, the wires and the tubes may be omitted and hence the material cost is reduced. Further, if the removal of the coating of the wire and the application of the tubes on the wires are not necessary. Thus, the structure of the power supply unit or the electronic equipment incorporating the power supply unit is simplified and the cost is reduced.

Since the entire power supply circuit is assembled on a single printed circuit board and the linear circuit and the digital circuit of the electronic equipment are assembled on other circuit boards, the same power supply unit can be used for sister equipments which differ from each other only in external view or functions. Accordingly, a design period for a pattern of the printed circuit board of the power supply unit can be shortened.

It has been known that a resistance to an external power supply noise is lowered when the power supply circuit and other linear circuit and digital circuit are assembled on the same printed circuit board. In the present invention, since the power supply circuit is assembled on the separate printed circuit board and spaced from other circuits, the electronic equipment is resistant to a malfunction due to the external noise.

What we claim is:

1. An electronic apparatus having a power supply unit for supplying a voltage to electrical parts, said unit comprising:
    a case for holding said electrical parts;
    a power transformer having an electrode, including a terminal, and being fixed to said case, said power transformer supplying a voltage;
    a printed circuit board having printed wiring thereon and being fixed to said terminal of said electrode of said power transformer for electrically interconnecting the voltage supplied by said power transformer through said electrode to said electrical parts, said printed circuit board further being formed with a fitting portion; and
    a printed circuit board fitting part integrally formed with said case for interfitting with said fitting portion.

2. An electronic apparatus according to claim 1, wherein said case is fixed to said printed circuit board fitting part formed with said case.

3. An electronic apparatus according to claim 1, wherein said printed circuit board has a plug receptacle and a power switch fixed thereto.

4. An electronic apparatus having a power supply unit for supplying a voltage to electrical parts, said unit comprising:
    a case for holding said electrical parts;
    a power transformer having an electrode, including a terminal, and being fixed to said case, said power transformer supplying a voltage;
    a printed circuit board having printed wiring thereon and being fixed to said terminal of said electrode of said power transformer for electrically interconnecting the voltage supplied by said power transformer through said electrode to said electrical parts;
    a plug receptacle fixed to said printed circuit board for receiving power; and
    a switch fixed to said printed circuit board for controlling the supply of power supplied through said plug receptacle to said power transformer and the blockage of power supplied through said plug receptacle from said power transformer.

5. An electronic apparatus according to claim 4, further comprising a fitting portion for fitting said printed circuit board to said case.

6. An electronic apparatus comprising:
    a housing for accommodating said electronic apparatus;
    a plurality of parts for forming said electronic apparatus in said housing;
    a printed circuit board having at least two of said parts mounted thereon for electrically interconnecting said mounted parts; and
    fixing means for fixing one of said parts mounted on said printed circuit board to said housing, wherein said fixing means indirectly fixes said printed circuit board to said housing.

7. An electronic apparatus according to claim 6, wherein said one of said parts fixed to said housing by said fixing means is a power transformer.

8. An electronic apparatus according to claim 6, wherein said plurality of parts are used for forming a power supply portion of said electronic apparatus.

* * * * *